United States Patent
Lojek

(10) Patent No.: US 7,341,911 B2
(45) Date of Patent: Mar. 11, 2008

(54) METHOD OF MAKING EEPROM TRANSISTOR PAIRS FOR BLOCK ALTERABLE MEMORY

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/126,418

(22) Filed: May 11, 2005

(65) Prior Publication Data
US 2005/0213391 A1 Sep. 29, 2005

Related U.S. Application Data

(62) Division of application No. 10/639,073, filed on Aug. 11, 2003, now Pat. No. 6,933,557.

(51) Int. Cl.
*H01L 29/80* (2006.01)

(52) U.S. Cl. .............. 438/257; 438/201; 257/E21.68; 257/E27.103

(58) Field of Classification Search .......... 438/257, 438/201; 257/315, E21.69, E21.103, E21.209, 257/E21.68, E27.103
See application file for complete search history.

(56) References Cited

U.S. PATENT DOCUMENTS

| | | | |
|---|---|---|---|
| 4,783,766 A | 11/1988 | Samachisa et al. | 365/185 |
| 4,853,895 A | 8/1989 | Mitchell et al. | 365/185 |
| 4,949,309 A | 8/1990 | Rao | 365/218 |
| 5,066,992 A | 11/1991 | Wu et al. | 357/23.5 |
| 5,225,700 A | 7/1993 | Smayling | 257/321 |
| 5,329,487 A | 7/1994 | Gupta et al. | 365/185 |
| 5,355,347 A | 10/1994 | Cioaca | 365/230.08 |
| 5,397,726 A | 3/1995 | Bergemont | 437/43 |
| 5,523,980 A | 6/1996 | Sakui et al. | 365/230.08 |
| 5,793,079 A | 8/1998 | Georgescu et al. | 257/316 |
| 5,811,852 A | 9/1998 | Ling | 257/315 |
| 5,998,261 A * | 12/1999 | Hofmann et al. | 438/257 |
| 6,160,287 A | 12/2000 | Chang | 257/321 |
| 6,172,395 B1 * | 1/2001 | Chen et al. | 257/315 |
| 6,236,594 B1 | 5/2001 | Kwon | 365/185.11 |
| 6,420,753 B1 | 7/2002 | Hoang | 257/321 |
| 6,468,863 B2 | 10/2002 | Hsieh et al. | 438/261 |
| 6,486,032 B1 | 11/2002 | Lin et al. | 438/266 |
| 6,522,580 B2 | 2/2003 | Chen et al. | 365/185.02 |
| 6,563,733 B2 | 5/2003 | Liu et al. | 365/185.01 |
| 6,567,313 B2 | 5/2003 | Tanaka et al. | 365/185.28 |
| 6,597,047 B2 | 7/2003 | Arai et al. | 257/411 |
| 6,875,660 B2 * | 4/2005 | Hung et al. | 438/279 |
| 6,955,957 B2 * | 10/2005 | Shin | 438/196 |
| 2002/0135013 A1 | 9/2002 | Chiu | 257/316 |

* cited by examiner

*Primary Examiner*—Andy Huynh
(74) *Attorney, Agent, or Firm*—Schneck & Schneck; Thomas Schneck

(57) ABSTRACT

A block alterable memory cell has a select control gate extending from a floating gate region to a drain region. The block alterable memory cell comprises a substrate layer that further includes a source implant region, a floating gate transistor region, and a drain implant region. A tunnel oxide layer overlies the substrate layer and is deposited to a thickness of approximately 70 angstroms. A first oxide layer overlies the tunnel oxide layer, with an inter poly layer overlying the first oxide layer, and a second poly layer extending over the floating gate transistor region to an edge of the drain implant region.

5 Claims, 7 Drawing Sheets

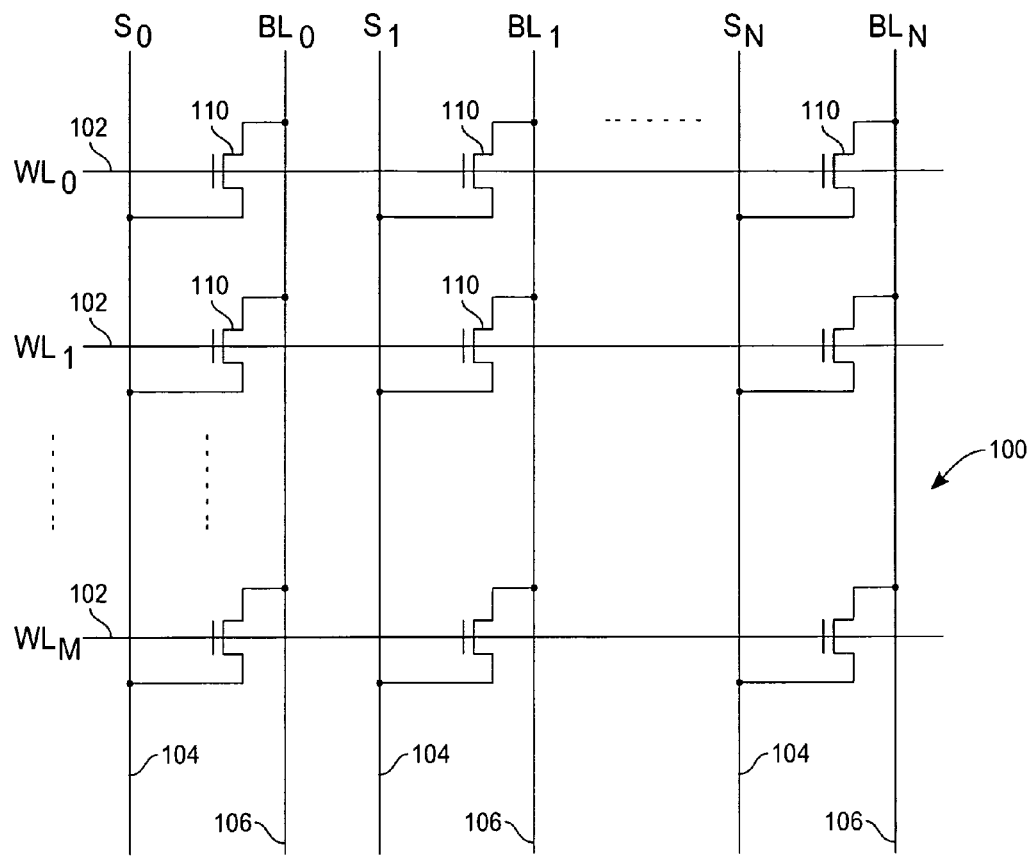
*Fig. 1* (PRIOR ART)
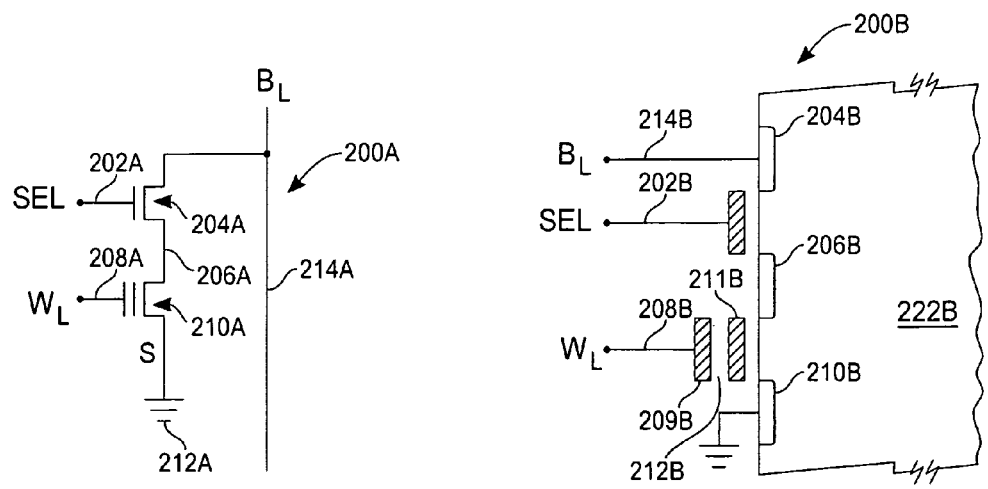
*Fig. 2A* (PRIOR ART)   *Fig. 2B* (PRIOR ART)

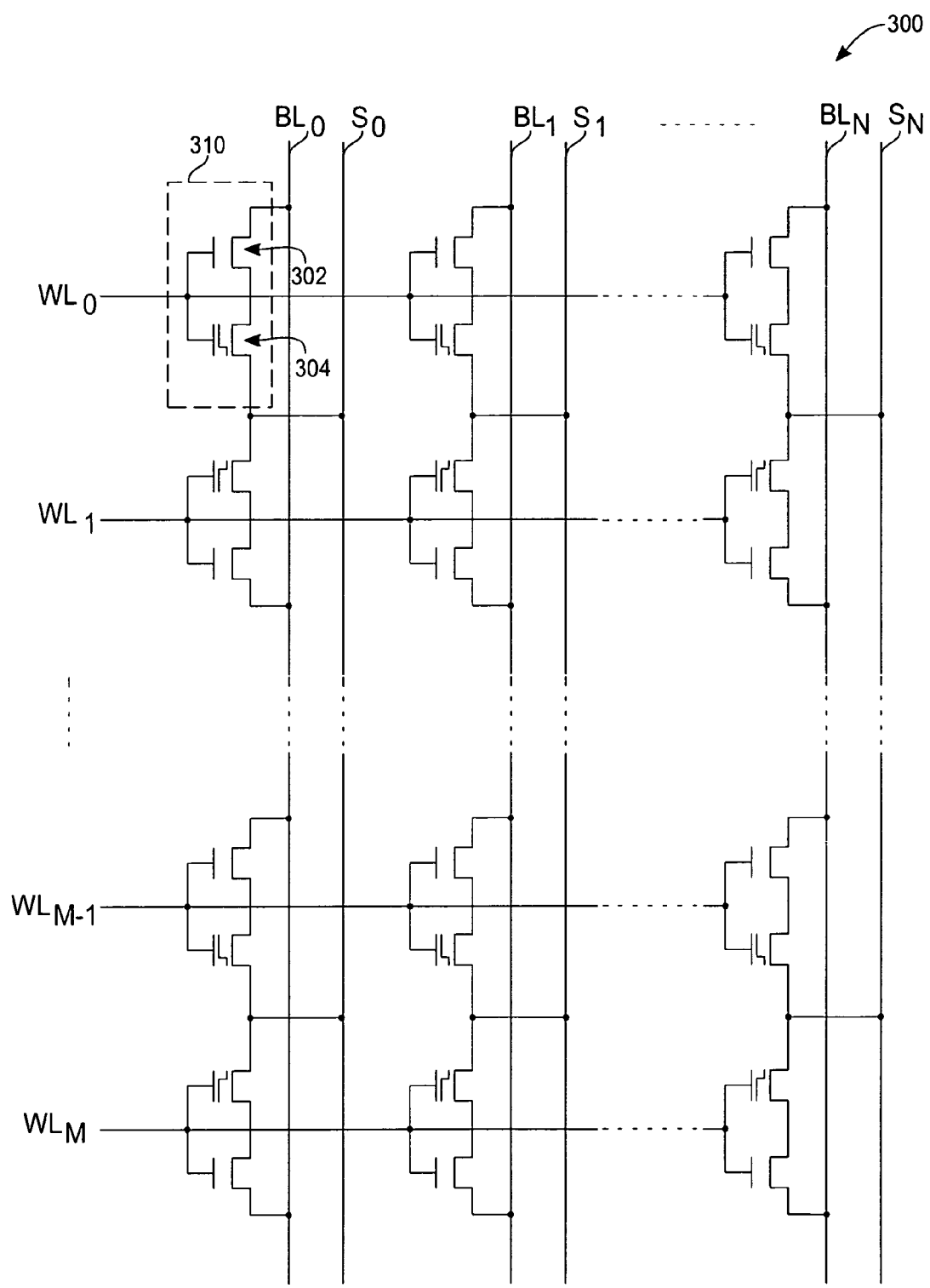
Fig._3A

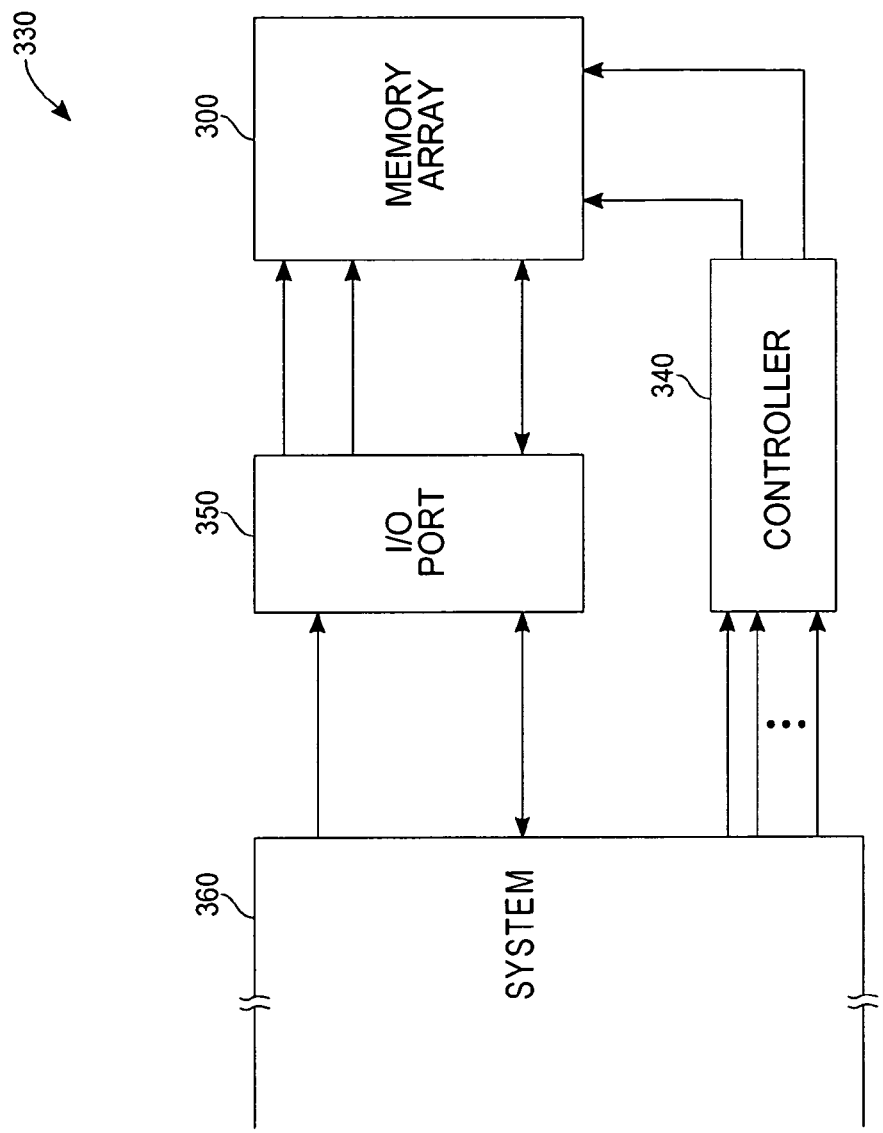
Fig._3B

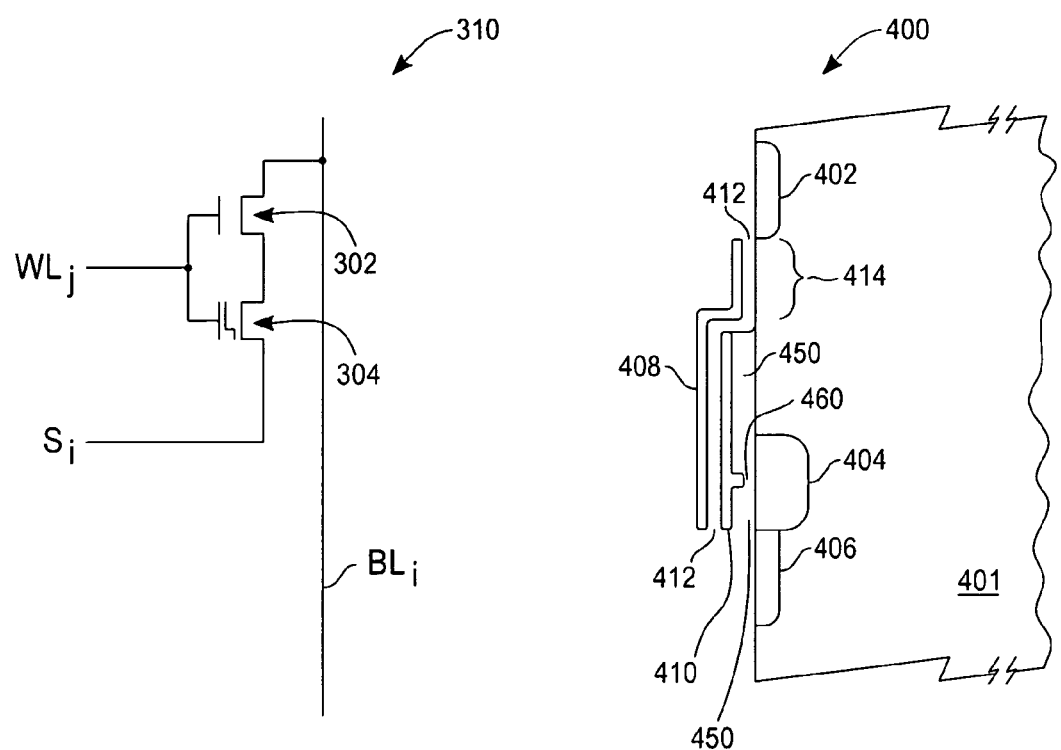
Fig._4A        Fig._4B

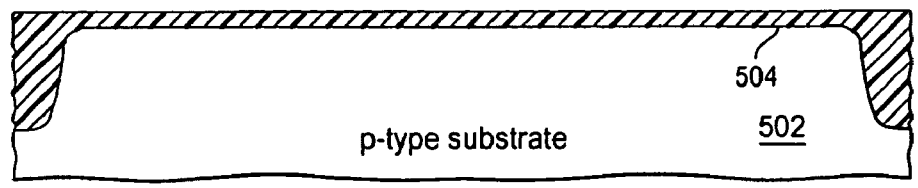
Fig._5A
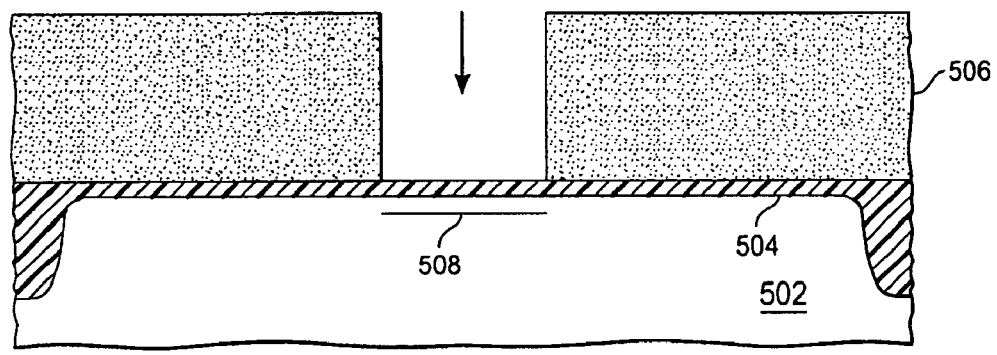
Fig._5B
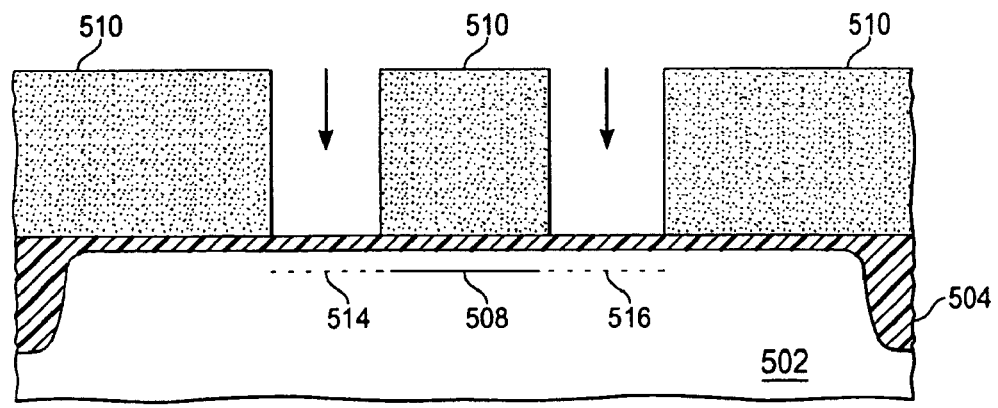
Fig._5C

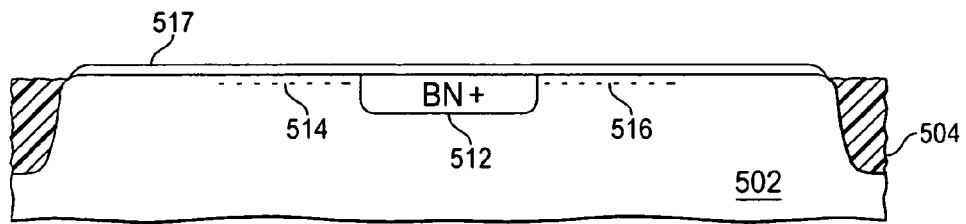
*Fig._5D*
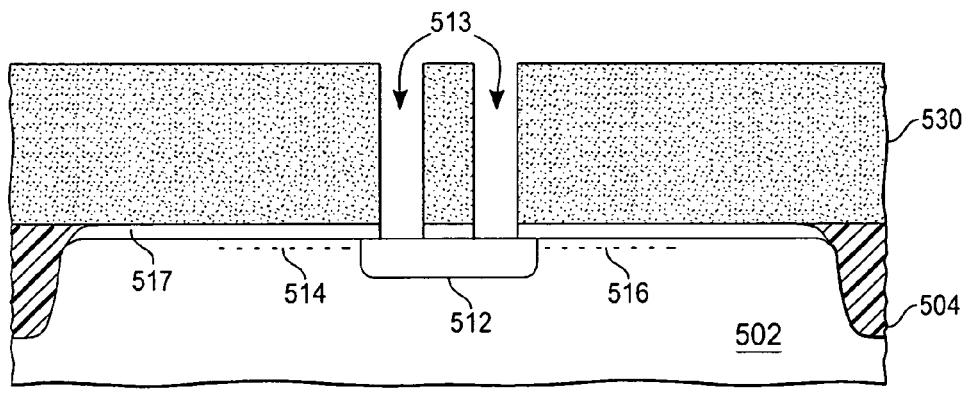
*Fig._5E*
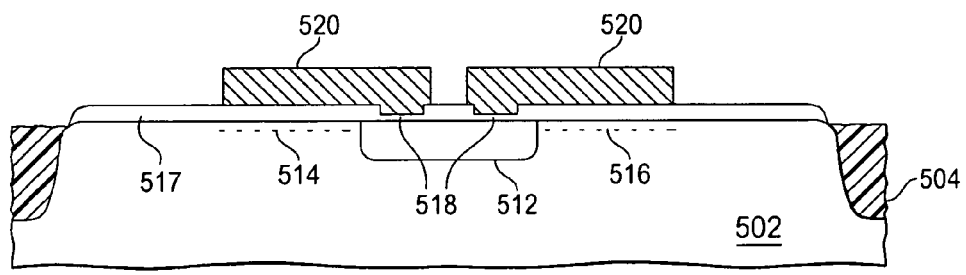
*Fig._5F*
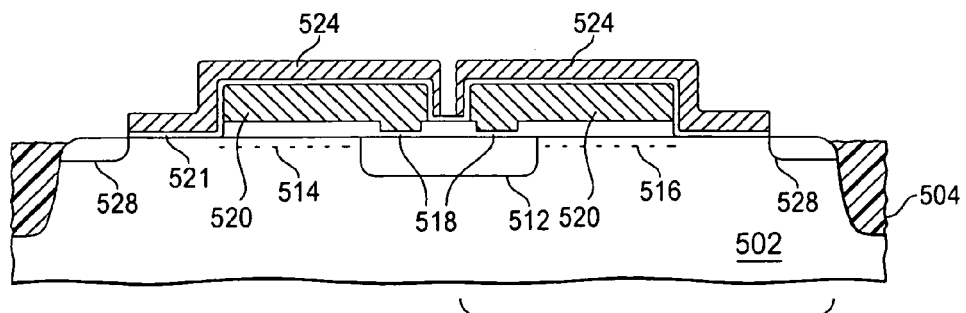
*Fig._5G*

METHOD OF MAKING EEPROM TRANSISTOR PAIRS FOR BLOCK ALTERABLE MEMORY

CROSS-REFERENCE TO RELATED APPLICATION

This is a divisional of U.S. patent application Ser. No. 10/639,073, filed Aug. 11, 2003, now U.S. Pat. No. 6,933,557.

TECHNICAL FIELD

The present invention relates in general to semiconductor devices. More specifically, the present invention relates to block alterable memory devices.

BACKGROUND ART

The need for a high-density block alterable memory devices is ever increasing. Cellular phones, memory sticks, digital cameras, laptop computers, and personal data assistants are a few examples of small devices that demand higher density memories. These devices require alterable memories because their contents change every time they are in use. For example, the size of a memory stick is as small as a pen but it can store 256 MB memory. The memory stick has a Universal Standard Bus (USB) port that can plug into another USB memory port of a computer to transfer the data from the hard drive of that computer. Therefore, the memory stick and other similar devices such as camera memories need a high-density alterable memory device to erase old data and store new data. The Electrically erasable programmable read only memory (EEPROM) common in the industry cannot be used in these applications because EEPROM is not alterable under normal operation conditions.

A typical block alterable memory device employs flash memory to program, read, or erase memory cells. With reference to FIG. 1, a flash memory 100 is a memory array which is arranged in rows 102 and columns 106. Each row 102 has N+1 memory cells connecting to source lines $S_0$-$S_N$. The first memory cell in the row 102 belongs to column $BL_0$ and the $N^{th}$ memory cell belongs column $BL_N$. Therefore, there are N+1 columns in the flash memory array 100. The gates of all the cells within a column 106 are coupled together to form a wordline $WL_i$ 102. There are M+1 wordlines or rows in the flash memory array 100, ranging from $WL_0$ to $WL_M$. The sources of the cells in each column are coupled together and coupled to the select lines 104, ranging from $S_0$ to $S_N$. The drains of the cells in each row are coupled together to form a bitline 106, ranging from $BL_0$ to $BL_N$. The flash array 100 enables users to electrically program and erase information stored in a memory cell 110.

Each memory cell 110 in the flash memory matrix 100 is a floating gate transistor. The structure of a floating gate transistor is similar to a traditional MOS device, except that an extra polysilicon strip is inserted between the gate and the channel. This strip is not connected to anything and called a floating gate. The threshold voltage of a floating gate transistor is programmable. The described flash memory 100 uses the Fowler-Nordheim tunneling effect to program a cell 110. Programming is a process wherein electrons are placed in the floating gate. Programming occurs when applying a high voltage between the gate and source, and gate and drain terminals that a high electric field causes injection of carriers into the floating gate. Electrons acquire sufficient energy to become hot and traverse the first oxide insulator, so they get trapped on the floating gate. Programming is done on a bit basis by applying a correct voltage at the bitline 106 of each cell 110.

The floating gate layer allows the cell 110 to be electrically erased through the gate. Erase and program operations of the memory array 100 can be done on more than one cell at a time. However, the alterable flash memory device has reliability and durability problems because the voltages for erasing and programming are very high.

With reference to Table 1 at the end of this specification, in order to achieve block alterable memory, the memory cell 110 in the flash memory array 100 as shown in FIG. 1 needs to apply +10 volts or −10 volts across the wordline $WL_i$ 102, the source line $S_i$ 104, and the bitline $BL_i$ 106. Accordingly, the placement of such high voltages to a single memory cell transistor 110 presents reliability and durability problems. Over long periods of time, placing high voltages on the memory device 100 may alter a program stored in each cell 110.

One prior art solution to this problem (for example, U.S. Pat. No. 5,066,992 to T.C. Wu) is shown in FIG. 2A. This solution places an extra select transistor 202A in series with a flash memory cell 210A. The gate of the additional select transistor 202A is coupled to the select line $S_0$ to $S_N$, the drain 204A is coupled to the bitline $BL_0$ to $BL_N$ 214A, and the source 206A is coupled to the drain of the flash cell. Thus, when a select line $S_i$ is ON, each selected transistor connected to the select line $S_i$ is turned ON. As a result, the voltage of the drain of the flash cell 210A is proportional to the voltage of the bitline $B_i$. During a reading cycle, the bitline 214A is open, the select line $S_i$ is grounded, and the wordline $WL_i$ is at negative program voltage $V_D$. Thus, a program stored in an EEPROM device 200A remains unaltered. Thus, the memory array 100 lasts longer and avoids the reliability and durability of one-transistor memory cells presented above. However, the two-transistor memory cells require larger areas for manufacturing because each memory cell has two transistors.

Referring to FIG. 2B, various cross-sectional views of a memory array 200B are shown. Memory array 200B is formed on a face of a semiconductor substrate 222B. Substrate 222B is doped with a p-type majority carrier. Bitline BL 214B, select line SEL 202B, wordline WL 208B and the source are n-type and implanted within substrate 222B at the surface. The gate comprises a first poly layer 209B, a second poly layer 211B, and an inter poly layer 212B. Accordingly, column lines 214B and 206B serves as a source and drain of transistors which are used in forming memory cells contained within memory array 200B. Each of the column lines 214B serves as a source of one memory cell or a drain of an adjacent cell. However, this solution dedicates large sections on the semiconductor substrate to the alterable block function. An undesirably low density flash memory results. Consequently, the industry has a need for a memory device structure which has block alterable capability without dedicating semiconductor substrate area to that function.

U.S. Pat. No. 4,783,766 to Samachisa et al. describes a memory cell of a block alterable EEPROM in which a single control gate is common to both the floating gate memory cell and the select transistor device. However, the device is formed using a different process flow from that of flash memory devices, thus requiring a separate masking sequence.

U.S. Pat. No. 6,420,753 to Hoang describes a similar structure to that of the Samachisa patent. It is stated that these memory cells can be manufactured without requiring additional processing steps from those of comparable flash memories.

SUMMARY OF THE INVENTION

A Fowler-Nordheim block alterable memory cell in accordance with the present invention is carried out in one form by a memory cell constructed from two separate transistor cells that have common select-control gates. The two cells are constructed on a substrate or in a well that exhibits a first (e.g., "p" or acceptor) conductivity type. A tunnel oxide layer resides on the substrate face. The select-control gate structure comprises a first poly layer, an interpoly layer, and a second poly layer. The second poly layer is extended to connect to the gate of the first cell to form a common select-control gate poly layer. The extended portion of the common select-control layer communicates with a drain implant region. A buried n+ implant region is formed near the surface of the p-substrate. The floating gate region is positioned above the buried implant and extends over the channel of each memory transistor. A self-aligned source/drain implant is located at or near edges of the control gate poly. The area of the substrate between the floating gate region and the drain implant region that lies underneath the extended portion of the common select-control layer is known as the active region. Thus, the Fowler-Nordheim block alterable memory device in accordance with the present invention is constructed as a single transistor memory cell but it behaves as a two transistor cell because of the extended select-control layer.

In manufacturing a memory cell to achieve a Fowler-Nordheim block alterable memory cell as described above, one first deposits a screen oxide of about 150 angstroms thickness over the p-type substrate. Then a photoresist mask with an opening is added on top of the screen oxide layer. A cell channel and buried n+ implants are implanted at the location of the opening of the mask and near the surface of the p-substrate. Next, the screen oxide is etched and initial gate oxides are grown. A tunnel window mask is then formed. A tunnel oxide is etched in the screen oxide layer where the windows of the tunnel window mask are located. The first polycrystalline silicon (poly) layer over the tunnel oxide and cell implants are deposited. An insulating layer is formed overlying the first poly layer. An extended second poly layer is deposited over the insulating layer. Finally, the device is completed by source and drain implants and other final processing.

BRIEF DESCRIPTION OF THE DRAWINGS

FIG. 1 illustrates a schematic diagram of a prior art memory array having single flash memory cells.

FIG. 2A illustrates a schematic diagram of a prior art dual transistor memory cell that has block alterable capability. The top cell is used to define the block to be altered, and the second cell or flash cell is used to store data information.

FIG. 2B illustrates a sectional view of the dual transistor memory cell of FIG. 2A.

FIG. 3 illustrates a schematic diagram of a Fowler-Nordheim alterable block memory array in accordance with the present invention.

FIG. 4A illustrates a schematic diagram of a single cell from the Fowler-Nordheim alterable block memory array in accordance with the present invention.

FIG. 4B illustrates a cross sectional view of a Fowler-Nordheim block alterable memory cell as illustrated in FIG. 4A.

FIGS. 5A-5G illustrate exemplary cross sectional views of process steps in accordance with the present invention.

FIG. 5A illustrates a cross sectional view of a substrate with a screen oxide layer.

FIG. 5B illustrates a cross sectional view of a barrier mask layer with a window for depositing a cell implant in the substrate.

FIG. 5C illustrates a cross sectional view of a mask-out implant.

FIG. 5D illustrates a cross sectional view of a p-substrate with a buried n+ implant, a source implant, and a drain implant.

FIG. 5E illustrates a cross sectional view of a Fowler-Nordheim cell with a window tunnel mask and etch oxide.

FIG. 5F illustrates a cross sectional view of a Fowler-Nordheim block alterable memory cell with a tunnel oxide layer and a first polycrystalline layer.

FIG. 5G illustrates cross sectional view of a Fowler-Nordheim block alterable cell with an oxide-nitride-oxide (ONO) deposition and a control poly layer deposition.

BEST MODE FOR CARRYING OUT THE INVENTION

Figure 6:
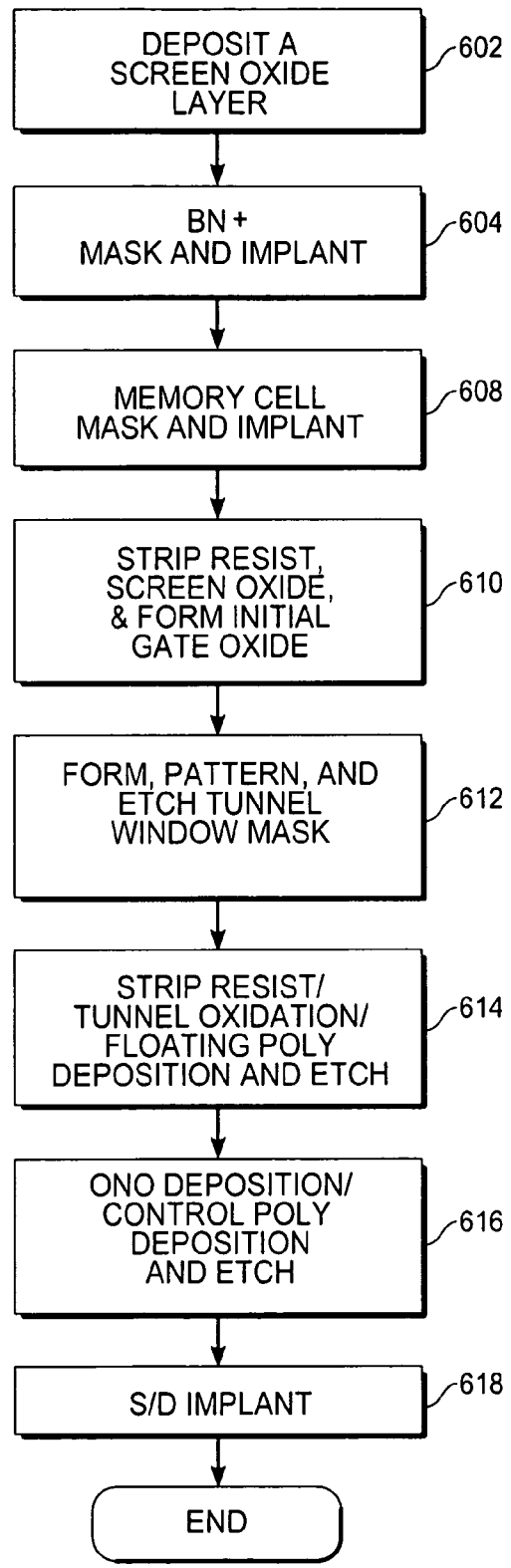
FIG. 6 illustrates a flowchart of a method for manufacturing the Fowler-Nordheim block alterable cell corresponding to FIGS. 5A-5G.

FIGS. 3, 4A, and 4B show various views of an exemplary embodiment of a Fowler-Nordheim block alterable memory architecture fabricated according to a method of the present invention. With respect to FIG. 3, a memory array 300 includes a plurality of memory cells 310. The memory cell 310 includes a select transistor 302 and a memory transistor 304 which share a common control gate. The plurality of memory cells 310 may be erased and programmed in blocks or programmed or read bit-by-bit by applying appropriate voltages to the bitlines ($BL_o$ to $BL_N$), source lines ($S_o$ to $S_N$) and wordlines ($WL_o$ to $WL_M$). Typically all memory cells 310 in the array 300 are normally constructed as a result of similar process steps, and therefore, all cells are similar in structure.

Referring to FIG. 4A, a schematic of a memory cell 310 in accordance with the present invention includes a memory transistor 304 connected in series with a select transistor 302 at a drain/source junction. (The drain of the memory transistor 304 is coupled to the source of the select transistor 302). The source of the memory transistor 304 is coupled to a select line $S_i$. The drain of the select transistor 302 is coupled to a bitline $BL_j$. A common gate of the memory transistor 304 and select transistor 302 is coupled to a wordline $WL_j$. This common gate for the memory 304 and select 302 transistors can be manufactured as a single cell having an extended and continuous poly layer, thus reducing an area of the memory cell 310.

With reference to FIG. 4B, a cross sectional view 400 of the memory cell 310 is illustrated. The memory cell 400 is formed on a semiconductor substrate (or well) 401 of a first conductivity type, which in the exemplary embodiment is p-type. A drain implant region 402 and a source implant region 406, are implanted within an uppermost surface of the substrate 401. A buried, heavily doped implant 404 for the floating gate region is also formed within an uppermost surface of the substrate 401. The implant regions 402, 404, and 406 are of a second conductivity type of a polarity opposite that of the conductivity type of the substrate 401. In a specific exemplary embodiment, the implants are n-type. The buried implant 404 is of n+ conductivity and serves as a tunneling charge source for a floating gate of the memory transistor 400. The drain implant region 402 and the buried implant 404 are spaced apart, so as to define an active region 414 therebetween. Accordingly, the drain implant region 402 connects to the bitline $BL_i$. The source implant region 406 connects to the source line $S_i$.

A first poly layer 410, forming the floating gate of the memory transistor 304, overlays the buried implant region 404, separated therefrom by a gate ONO layer 450. A second poly layer 408, forming a common control gate, extends continuously over the first poly layer 410 (which forms the floating gate) from the source dopant region 406 to the drain dopant region 402, overlaying both the buried implant 404 and the select transistor 302 active region 414. A tunnel oxide 460 of thickness 50-70 angstroms is formed in a tunnel window region between the buried implant 404 and the floating gate 410B.

An exemplary manufacturing process of the memory cell 310 is shown in the flowchart of FIG. 6 and a result after each step is shown in FIGS. 5A-5G. With reference to FIG. 5A, according to a preferred process of manufacturing the present invention, at step 602, a screen oxide 504 is deposited over a substrate 502. The thickness of the screen oxide layer is approximately 150 angstroms.

Referring to FIGS. 5B and 6, at step 604, a photoresist mask 506 is applied at face 504 of substrate 502. This mask 506 is patterned so as to permit ion implantation of a floating gate region though gaps in the photoresist mask 506. A buried N+ tunnel region 508 is implanted in semiconductor substrate 502 through the opening of the mask 506 and the mask 506 is then removed using a conventional process. The substrate 502 is then annealed in, for example, a 900° C. nitrogen environment to ameliorate damage caused to substrate 502 by the prior implantation step 604 and to diffuse the tunnel implant region 508 into substrate 502.

Referring to FIGS. 5C and 6, at step 608, after the annealing treatment of the substrate 502, another mask 510 is formed on top of the oxide layer 504 for memory cell implantation. Resulting cell implant regions 514 and 516 and buried implant region 512 are seen in FIG. 5D.

Referring to FIGS. 5D and 6, at step 610, the screen oxide is etched away and an initial gate oxide layer 517 is formed in its place.

Referring to FIGS. 5E and 6, at step 612, a tunnel window mask 530 is deposited to a very high thickness so that an opening for a tunnel oxide layer 513 can be precisely positioned at the openings of this tunnel window mask 530 layer above the buried implant 512.

With reference to FIGS. 5F and 6, at step 614, after etching away the gate oxide layer 517 in the tunnel windows, a thin tunnel oxide layer 518 is deposited to a thickness of about 50-70 angstroms. In a preferred embodiment the tunnel oxide layer 518 represents a thin, high quality silicon dioxide layer which may either be grown in a dry $O_2$ and HCl mixture atmosphere at a temperature of around 800° to 850° C. Once the tunnel oxide 518 has been formed, polysilicon floating gates 520 are formed over the gate 517 and tunnel oxide 518 layers.

Referring to FIGS. 5G and 6, at step 616, an oxide or oxide nitride oxide (ONO) interpoly dielectric 521 is deposited and an etch is performed to create interpoly insulation.

Next, a control gate poly layer (not shown) is applied using an LPCVD process. The deposition of the poly layer is a low temperature application, preferably at less than 625° C., which tends to maintain the poly layer in an amorphous state.

The poly layer is patterned and etched to produce strips of materials which form control gates 524. The control gate 524 polysilicon extends beyond the area above the floating gate 520 to adjacent areas to form a common select gate. In addition, this pattern and etch step removes material from the poly layer thereby forming the remaining two sides for each of floating gates 520.

Finally, finishing step 618 is shown in FIG. 6, such as adding select transistor drain implants 528 and a nitride overcoat may be performed to complete the process. Using the control gate 524 poly layer as a mask, source implants 528 for the select transistor are made just past the outer edge of the control gate 524 poly.

A memory device constructed according to the teaching of the present invention may be block erased and programmed, and also bit programmed. Referring to Table 1 and FIG. 3, in block programming, memory cell transistor sources, $S_o$ to $S_N$, in a block, and also the select transistor drains (the bitlines $BL_o$ to $BL_N$) are held at a large negative potential, such as −10 volts, while the memory cell transistor control gates in the block (the wordlines $WL_o$ to $WL_N$) are raised to a relatively high positive voltage, such as 10 volts. This causes tunneling of electrons from the buried implant through the tunnel oxide into the floating gates.

Memory cells may be block erased by leaving sources $S_o$ to $S_N$ in the block open, and reversing the word and bitline voltages from the block programming case. Placing bitline electrodes in the block at a relatively high positive voltage, such as 10 volts, and the wordline electrodes in the block at negative 10 volts, causes electrons be expelled out of the floating gate region back into the buried implant.

Bit programming involves applying a large positive potential to the wordlines and to all bitlines except a selected bitline $BL_{i+1}$, which is at ground potential. The source lines $S_O$ to $S_N$ are left open.

Memory cells in the present invention may be read by placing the control gate $WL_{i+1}$ of a particular cell ($_{i+1}$) to be read at positive $V_D$, and at the same time, placing the drain (bitline) of the particular cell to be read at a relatively low (about 1 volt) voltage $V_s$. All source lines $S_o$ to $S_N$ are grounded in read mode. Cells not in the selected word (row) and bit column have negative $V_D$ voltages applied to their wordlines and bitlines that are open.

TABLE 1

Voltages Required for Block Programming/Erasing in a Block Alterable Memory.

|  | $WL_i$ | $WL_{i+1}$ | $S_i$ | $BL_i$ | $S_{i+1}$ | $BL_{i+1}$ | $S_{i+2}$ | $BL_{i+2}$ |
|---|---|---|---|---|---|---|---|---|
| Block programming | +10 V | +10 V | −10 V | −10 V | −10 V | −10 V | −10 V | −10 V |
| Block Erase | −10 V | −10 V | Open | +10 V | Open | +10 V | Open | +10 V |

TABLE 1-continued

Voltages Required for Block Programming/Erasing in a Block Alterable Memory.

|  | $WL_i$ | $WL_{i+1}$ | $S_i$ | $BL_i$ | $S_{i+1}$ | $BL_{i+1}$ | $S_{i+2}$ | $BL_{i+2}$ |
|---|---|---|---|---|---|---|---|---|
| Bit (i + 1) program | +10 V | +10 V | Open | +10 V | Open | 0V | Open | +10 V |
| Read (I + 1) | −VD | VD | GND | Open | GND | Vs~1 V | GND | Open |

The invention claimed is:

1. A method of manufacturing a block alterable memory comprising:

forming a pair of mirror image tunnel windows over a first buried implant in a semiconductor substrate, forming pairs of mirror image floating gate transistors having mirror image select transistors, and the floating gate transistors symmetrically sharing the buried implant as a first subsurface electrode, each select transistor associated with one of the floating gate transistors, forming mirror image control gates with each control gate extending over an associated floating gate transistor and a select transistor in insulative relation, and then forming second buried implants as second subsurface electrodes outwardly of the control gates after the control gates have been formed.

2. The method of claim 1 further defined by forming the mirror image tunnel windows beneath mirror image floating gates.

3. The method of claim 1 wherein the mirror image select transistors extend outwardly of the mirror image floating gate transistors.

4. A method of manufacturing memory transistor pairs for a block alterable memory comprising:

forming a pair of mirror image tunnel windows over a single first subsurface electrode in a semiconductor substrate, forming a pair of mirror image floating gates each extending into a respective tunnel window, forming a pair of second subsurface electrodes spaced apart from the first subsurface electrode and from the floating gates, forming a pair of control gates, each control gate insulatively spaced over a floating gate and in electrical communication with the first subsurface electrode and one of the second subsurface electrodes, and the second subsurface electrodes being formed using the control gates as a mask.

5. The method of claim 4 wherein the second subsurface electrodes are in mirror image relation to the first subsurface electrodes.

* * * * *